(12) United States Patent
Yamamoto et al.

(10) Patent No.: US 11,502,656 B2
(45) Date of Patent: Nov. 15, 2022

(54) VARIABLE GAIN AMPLIFIER

(71) Applicant: MITSUBISHI ELECTRIC CORPORATION, Tokyo (JP)

(72) Inventors: Wataru Yamamoto, Tokyo (JP); Koji Tsutsumi, Tokyo (JP); Mitsuhiro Shimozawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 52 days.

(21) Appl. No.: 17/122,541

(22) Filed: Dec. 15, 2020

(65) Prior Publication Data
US 2021/0099144 A1 Apr. 1, 2021

Related U.S. Application Data

(63) Continuation of application No. PCT/JP2018/030068, filed on Aug. 10, 2018.

(51) Int. Cl.
*H03F 3/45* (2006.01)
*H03G 3/30* (2006.01)
*H03G 1/00* (2006.01)

(52) U.S. Cl.
CPC ....... *H03F 3/45179* (2013.01); *H03G 1/0023* (2013.01); *H03G 3/30* (2013.01); *H03G 2201/103* (2013.01)

(58) Field of Classification Search
CPC .. H03F 3/45179; H03F 2200/451; H03F 3/19; H03F 3/245; H03F 2203/45311; H03F 3/45188; H03F 3/45192; H03F 2203/45306; H03F 1/0261; H03F 3/211; H03F 3/72; H03F 3/45; H03F 3/45183; H03G 3/30; H03G 2201/103; H03G 1/0023; H03G 1/0029; H03G 1/0088; H03G 3/45098

(Continued)

(56) References Cited

U.S. PATENT DOCUMENTS 6,392,487 B1* 5/2002 Alexanian ............ H03G 1/0023
330/254
7,889,008 B2* 2/2011 Lee ...................... H03G 1/0023
330/311

(Continued)

FOREIGN PATENT DOCUMENTS

JP 10-276051 A 10/1998
JP 2007-259297 A 10/2007
(Continued)

*Primary Examiner* — Khanh V Nguyen
(74) *Attorney, Agent, or Firm* — Birch, Stewart, Kolasch & Birch, LLP

(57) ABSTRACT

A variable gain amplifier includes a first transistor group which is connected to an input terminal and an output terminal, and which amplifies a signal from the input terminal to output the amplified signal to the output terminal; a second transistor group connected to the input terminal; a third transistor group connected to the output terminal; and a controller configured to control the first transistor group, the second transistor group, and the third transistor group so that a total number of the number of transistors to be turned on in the first transistor group and the second transistor group is kept at a constant value, and total numbers of transistors to be turned on in the first transistor group and in the third transistor group are the same.

3 Claims, 8 Drawing Sheets

(58) Field of Classification Search
USPC .................................................. 330/51, 254
See application file for complete search history.

(56) References Cited

U.S. PATENT DOCUMENTS

| | | | |
|---|---|---|---|
| 10,581,395 B2* | 3/2020 | Tsutsumi | ................... H03F 3/72 |
| 2007/0222515 A1 | 9/2007 | Koutani et al. | |
| 2010/0237945 A1 | 9/2010 | Cassia et al. | |
| 2011/0221531 A1 | 9/2011 | Kim et al. | |
| 2015/0263691 A1* | 9/2015 | Takahashi | ............ H03G 1/0088 |
| | | | 330/254 |

FOREIGN PATENT DOCUMENTS

| | | |
|---|---|---|
| JP | 2012-521670 A | 9/2012 |
| JP | 2015-177321 A | 10/2015 |
| WO | WO 2010/082235 A1 | 7/2010 |
| WO | WO 2017/163334 A1 | 9/2017 |

* cited by examiner

VARIABLE GAIN AMPLIFIER

CROSS-REFERENCE TO RELATED APPLICATION

The present application is a continuation application filed under 35 U.S.C. 111(a) claiming benefit under 35 U.S.C. 120 and 365(c) of PCT international application No. PCT/JP2018/030068 filed on Aug. 10, 2018 and designating the U.S. The entire contents of the foregoing application are incorporated herein by reference.

BACKGROUND OF THE INVENTION

1. Field of the Invention

The present invention relates to a variable gain amplifier capable of changing a gain.

2. Description of the Related Art

A phased array antenna to be used for a radar apparatus or a wireless communication device, for example, is configured to use a variable gain amplifier and a phase shifter to control an amplitude and a phase of a high-frequency signal, to thereby change an irradiation direction of a beam. As the variable gain amplifier, there is a variable gain amplifier including cascode amplifiers including an amplifying transistor configured to amplify an input signal, and a plurality of cascode transistors connected in a cascade arrangement to an output terminal of the amplifying transistor; and a gate potential control circuit configured to control ON/OFF operations of the plurality of cascode transistors (see, for example, JP 2007-259297 A).

The plurality of cascade transistors are classified into signal transmitting transistors connected to an output terminal of the variable gain amplifier and signal shunting transistors connected to a power supply terminal. The output terminal is connected to an output terminal of each of the signal transmitting transistors.

In the related-art variable gain amplifier disclosed in JP 2007-259297 A, a proportion of each of the numbers of transistors is controlled so that the total number of the number of signal transmitting transistors to be turned on and the number of signal shunting transistors to be turned on is always constant. Through the control, it is possible to change an amount of current flowing through the output terminal, that is, to change a gain of the variable gain amplifier.

SUMMARY OF INVENTION

Technical Problem

When the total number of the number of signal transmitting transistors to be turned on and the number of signal shunting transistors to be turned on is set to be always constant, from the viewpoint of the amplifying transistor, an entire impedance of the plurality of cascode transistors is constant, or is substantially constant. However, from the viewpoint of the output terminal, with a change in the number of signal transmitting transistors to be turned on, that is, as a result of a change in gain, the entire impedance changes. Owing to the change in the impedance, an error occurs in the amount of current flowing through the output terminal, and a pass phase thus varies.

The present invention has been made in order to solve the above-mentioned problem, and has an object to provide a variable gain amplifier capable of further suppressing a variation of a pass phase due to a change in gain.

Solution to Problem

A variable gain amplifier according to the present invention includes a first transistor group which is connected to an input terminal and an output terminal, and which amplifies a signal from the input terminal to output the amplified signal to the output terminal; a second transistor group connected to the input terminal; a third transistor group connected to the output terminal; and a controller configured to control the first transistor group, the second transistor group, and the third transistor group so that a total number of the number of transistors to be turned on in the first transistor group and the second transistor group is kept at a constant value, and total numbers of transistors to be turned on in the first transistor group and in the third transistor group are the same.

Advantageous Effects of Invention

According to the present invention, it is possible to further suppress the variation of the pass phase as a result of the change in gain.

BRIEF DESCRIPTION OF DRAWINGS

Other objects and further features of embodiments will become apparent from the following detailed description when read in conjunction with the accompanying drawings, in which.

DETAILED DESCRIPTION OF THE PREFERRED EMBODIMENTS

Figure 1:
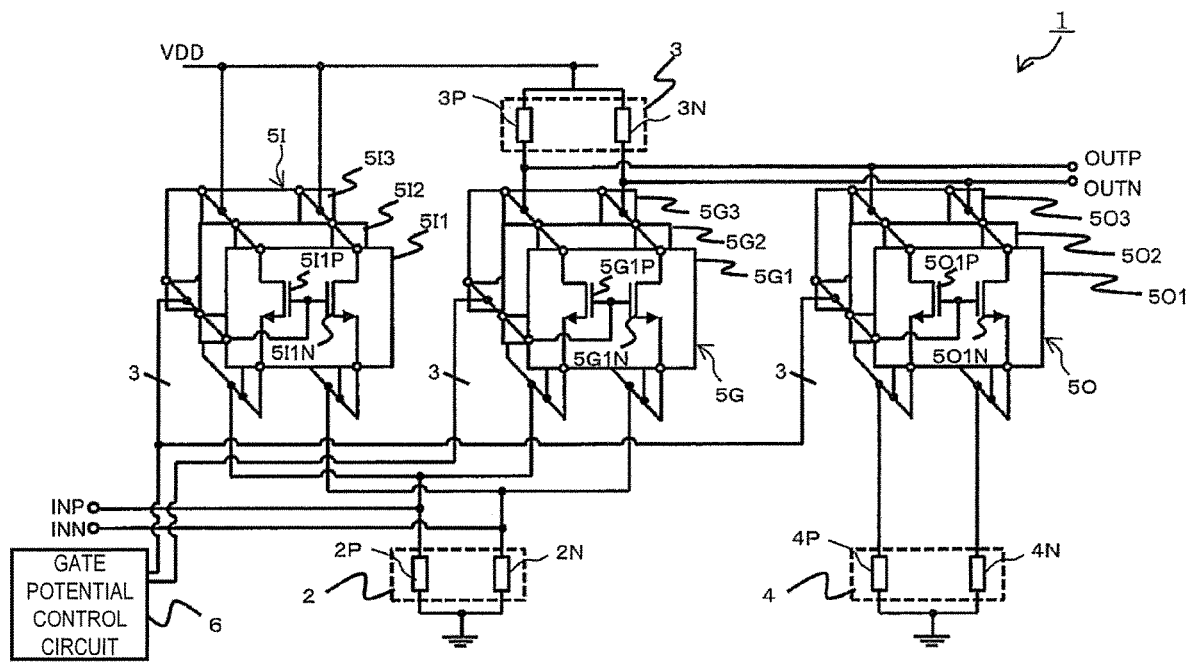
FIG. 1 is a configuration diagram for illustrating a variable gain amplifier according to a first embodiment of the present invention.

In the following, variable gain amplifiers according to embodiment of the present invention will be described with reference to the drawings. In the drawings, the same or corresponding components will be denoted by the same reference symbols.

First Embodiment

FIG. 1 is a configuration diagram for illustrating a variable gain amplifier according to a first embodiment of the present invention. As illustrated in FIG. 1, a variable gain amplifier 1 according to the first embodiment is a differential input and differential output amplifier, and includes input terminals INP and INN and output terminals OUTP and OUTN. A first load element pair 2 includes two load elements 2P and 2N, and one terminal of each of the load elements 2P and 2N is connected to a ground. The input terminals INP and INN are connected to the other terminals of the load elements 2P and 2N, respectively.

An input dummy group 5I corresponding to a second transistor group is connected between the first load element pair 2 and a power supply line VDD. The input dummy group 5I is used for short-circuiting signals, and FIG. 1 illustrates a state in which three input dummies 5I1 to 5I3 are connected in parallel. Herein, when a specific input dummy is not indicated, "5IN" is used as the reference symbol.

As illustrated in FIG. 1, the input dummy 5I1 is a differential pair in which two transistors 5I1P and 5I1N have gates grounded, respectively. For the two transistors 5I1P and 5I1N forming the differential pair, N-channel metal-oxide-semiconductor field effect transistors (MOSFETs) are adopted. The two transistors 5I1P and 5I1N have the gates connected to each other, have drains connected to the power supply line VDD, and have sources connected to the two load elements 2P and 2N, respectively. Although it is not illustrated, each of the input dummies 5I2 and 5I3 also has an internal configuration similar to that of the input dummy 5I1.

A second load element pair 3 includes two load elements 3P and 3N. One terminal of each of the load elements 3P and 3N is connected to the power supply line VDD, and the other terminals of the load elements 3P and 3N are connected to the output terminals OUTP and OUTN, respectively. An amplifier circuit group 5G corresponding to a first transistor group is connected between the second load element pair 3 and the first load element pair 2 described above. The amplifier circuit group 5G is used for amplifying signals, and FIG. 1 illustrates a state in which three amplifier circuits 5G1 to 5G3 are connected in parallel. Herein, when a specific amplifier circuit is not indicated, "5GN" is used as the reference symbol.

As illustrated in FIG. 1, the amplifier circuit 5G1 is, similar to the input dummy 5I1, a differential pair in which two transistors 5G1P and 5G1N have gates grounded, respectively. For the two transistors 5G1P and 5G1N forming the differential pair, N-channel MOSFETs are adopted. The two transistors 5G1P and 5G1N have the gates connected to each other, have drains connected to the two load elements 3P and 3N, respectively, and have sources connected to the two load elements 2P and 2N, respectively. Although it is not illustrated, each of the amplifier circuits 5G2 and 5G3 also has an internal configuration similar to that of the amplifier circuit 5G1.

A third load element pair 4 includes two load elements 4P and 4N, and one terminal of each of the load elements 4P and 4N is connected to the ground. An output dummy group 5O corresponding to a third transistor group is connected between the third load element pair 4 and the second load element pair 3. The output dummy group 5O is a component arranged in order to suppress a variation of an impedance from the viewpoint of the output terminals OUTP and OUTN, and FIG. 1 illustrates a state in which three output dummies 5O1 to 5O3 are connected in parallel. The impedance from the viewpoint of the output terminals OUTP and OUTN is hereinafter referred to as "output impedance." Further, when a specific output dummy is not indicated, "5ON" is used as the reference symbol.

As illustrated in FIG. 1, the output dummy 5O1 is, similar to the input dummy 5I1 and the amplifier circuit 5G1, a differential pair in which two transistors 5O1P and 5O1N each have a gate grounded. For the two transistors 5O1P and 5O1N forming the differential pair, N-channel MOSFETs are adopted. The two transistors 5O1P and 5O1N have the gates connected to each other, have drains connected to the two load elements 3P and 3N, respectively, and have sources connected to the two load elements 4P and 4N, respectively. Although it is not illustrated, each of the output dummies 5O2 and 5O3 also has an internal configuration similar to that of the output dummy 5O1.

All the gates of the respective transistors forming the input dummy group 5I, the amplifier circuit group 5G, and the output dummy group 5O are connected to a gate potential control circuit 6. The gate potential control circuit 6 is a device configured to output a control signal to the gate of each of the transistors to control an operation of each of the input dummy group 5I, the amplifier circuit group 5G, and the output dummy group 5O. That is, the gate potential control circuit 6 corresponds to a controller in the first embodiment.

In each of the input dummy group 5I, the amplifier circuit group 5G, and the output dummy group 5O, the gates of two transistors forming the differential pair are connected to each other. According to the configuration, in the input dummy group 5I, the amplifier circuit group 5G, and the output dummy group 5O, on/off operations of the two transistors are controlled in units of differential pairs.

The input dummy group 5I and the gate potential control circuit 6 are connected to each other by signal lines that are different for each input dummy 5IN. The amplifier circuit group 5G and the gate potential control circuit 6 are also connected to each other by signal lines that are different for each amplifier circuit 5GN.

Each of the signal lines connecting the input dummy group 5I and the gate potential control circuit 6 is connected to a signal line associated with the corresponding output dummy of the output dummy group 5O. For example, the signal line connected to the input dummy 5I1 of the input dummy group 5I is connected to the signal line to the output dummy 5O1 of the output dummy group 5O. The signal line connected to the input dummy 5I2 of the input dummy group 5I is connected to the signal line to the output dummy 5O2 of the output dummy group 5O, and the signal line connected to the input dummy 5I3 of the input dummy group 5I is connected to the signal line to the output dummy 5O3 of the output dummy group 5O. According to the above-described connection configuration, the number of input dummies 5IN operating in the input dummy group 5I coincides with the number of output dummies 5ON operating in the output dummy group 5O.

The gate potential control circuit 6 is configured to keep a total number of the number of input dummies 5IN operating in the input dummy group 5I and the number of amplifier circuits 5GN operating in the amplifier circuit group 5G at a constant value, and change a combination of those numbers depending on a gain to be set. According to the above-described configuration, for example, when the total number is assumed to be three, under a state in which one input dummy 5IN is caused to operate in the input dummy group 5I, two amplifier circuits 5GN among the three amplifier circuits 5G1 to 5G3 of the amplifier circuit group 5G operate.

Thus, in the output dummy group 5O, one output dummy 5ON operates. Under a state in which two input dummies 5IN are caused to operate in the input dummy group 5I, one amplifier circuit 5GN operates in the amplifier circuit group 5G. Thus, in the output dummy group 5O, two output dummies 5ON operate.

According to the above-described operations, irrespective of details of setting of the gain, a total number of the number of amplifier circuits 5GN operating in the amplifier circuit group 5G and the number of output dummies 5ON operating in the output dummy group 5O is also kept at a constant value. Both the amplifier circuit group 5G and the output dummy group 5O are connected to the output terminals OUTP and OUTN. Then, by selecting appropriately the impedances of the respective amplifier circuits 5G1 to 5G3 and the output dummies 5O1 to 5O3, irrespective of details of setting of the gain, it becomes possible to keep the output impedance at a constant value, or suppress the variation of the output impedance within an extremely narrow range. Thus, the variation of a pass phase due to a change in the gain can be avoided, or the variation can be suppressed within an extremely narrow range. Accordingly, desired characteristic of the variable gain amplifier 1 is achieved. The simplest selection of the impedances is to set the impedances of all the amplifier circuits 5GN and all of the output dummies 5ON to the same values, respectively.

In the first embodiment, all the number of input dummies 5IN, the number of amplifier circuits 5GN, and the number of output dummies 5ON are set to 3, but each of the numbers is not limited to 3. As the number is increased, resolution for setting the gain can be enhanced. Thus, the numbers may be determined in accordance with required resolution, for example. However, the number of input dummies 5IN is required to coincide with the number of output dummies 5ON.

Further, in the first embodiment, in order to simplify control operations and the like, the signal line from the output dummy 5ON is connected to the signal line to the input dummy 5IN, but each output dummy 5ON may be connected to the gate potential control circuit 6 by a signal line. Moreover, the input dummy group 5I and the amplifier circuit group 5G may be connected to different load element pairs. The gate potential control circuit 6 may be an analog circuit, but may also be a control device including a microcomputer and the like.

Second Embodiment

Figure 2:
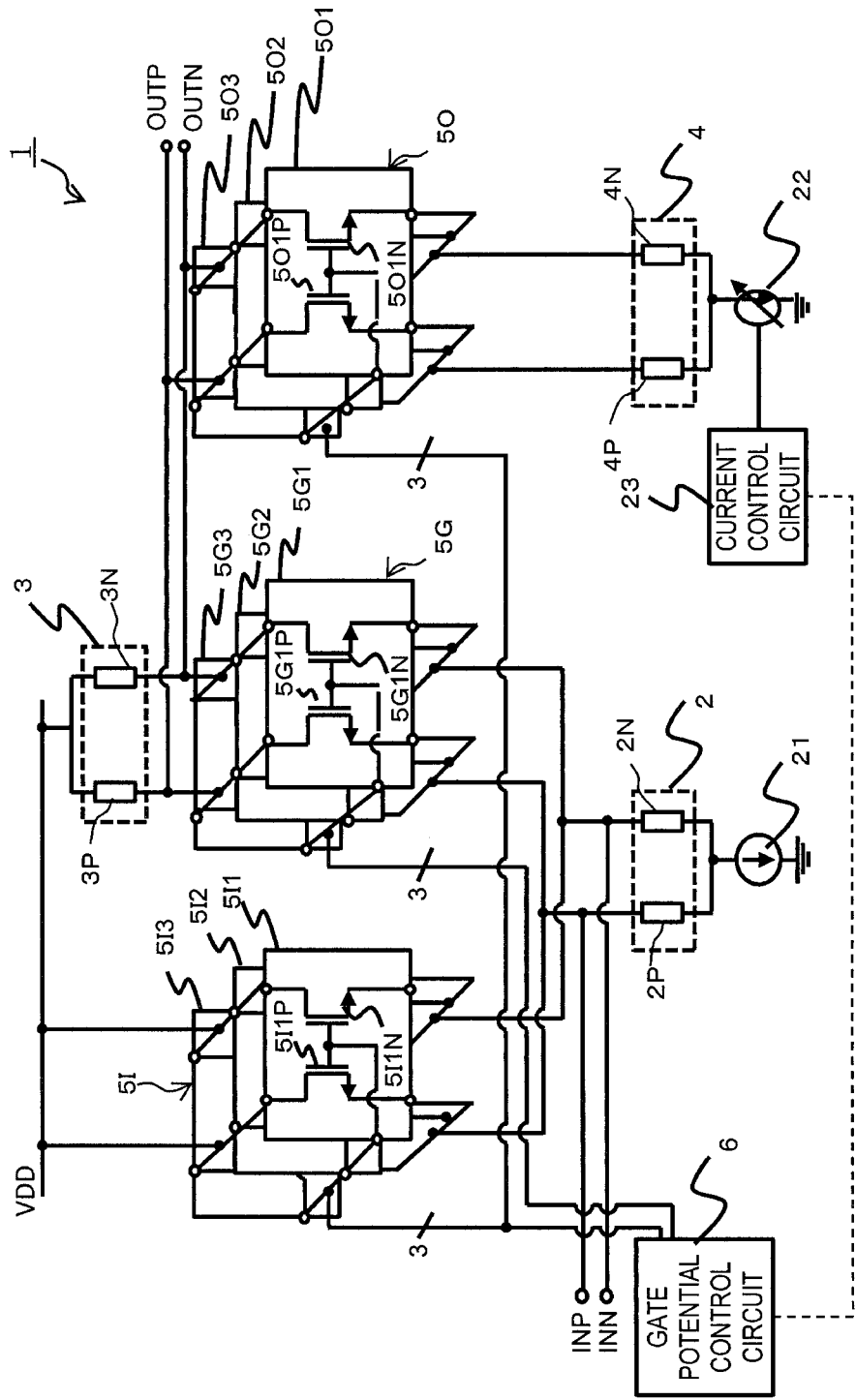
FIG. 2 is a configuration diagram for illustrating a variable gain amplifier according to a second embodiment of the present invention.

FIG. 2 is a configuration diagram for illustrating a variable gain amplifier according to a second embodiment of the present invention. Referring to FIG. 2, differences from the first embodiment described above will be described in detail.

In the second embodiment, as illustrated in FIG. 2, each of the two load elements 2P and 2N forming the first load element pair 2 has one terminal connected to the ground via a constant current source 21. Each of the two load elements 4P and 4N forming the third load element pair 4 has one terminal connected to the ground via a variable current source 22. In order to control a current value of the variable current source 22, a current control circuit 23 is connected to the variable current source 22.

As described above, the total number of the number of input dummies 5IN operating in the input dummy group 5I and the number of amplifier circuits 5GN operating in the amplifier circuit group 5G, in other words, the total impedance, is kept at a constant value. For this reason, the constant current source 21 is used to supply current that depends on the total number. However, current flowing through the output dummy group 5O depends on the operating output dummies 5ON or the number thereof. The operating output dummy 5ON or the number thereof depends on details of control for the input dummy group 5I.

Accordingly, the current control circuit 23 controls the variable current source 22 so that a value of current to be caused to be supplied therefrom coincides with a value of current flowing through the input dummy group 5I. For this control, the current control circuit 23 inputs, from the gate potential control circuit 6, an analog signal that depends on a combination of the input dummies 5IN to be caused to operate, or a digital signal that indicates the combination. The current control circuit 23, using the input signal, causes the variable current source 22 to supply current to be supplied.

In this way, in the second embodiment, using the constant current source 21 and the variable current source 22 appropriate amounts of current are supplied to the input dummy group 5I, the amplifier circuit group 5G, and the output dummy group 5O, respectively. Then, it is possible to control the gain more precisely compared with the first embodiment described above. Also in the second embodiment, similar effects to those in the first embodiment described above are obtained. Specifically, the variation of the pass phase due to a change in the gain is avoided, or the variation can be suppressed within an extremely narrow range.

Third Embodiment

Figure 3:
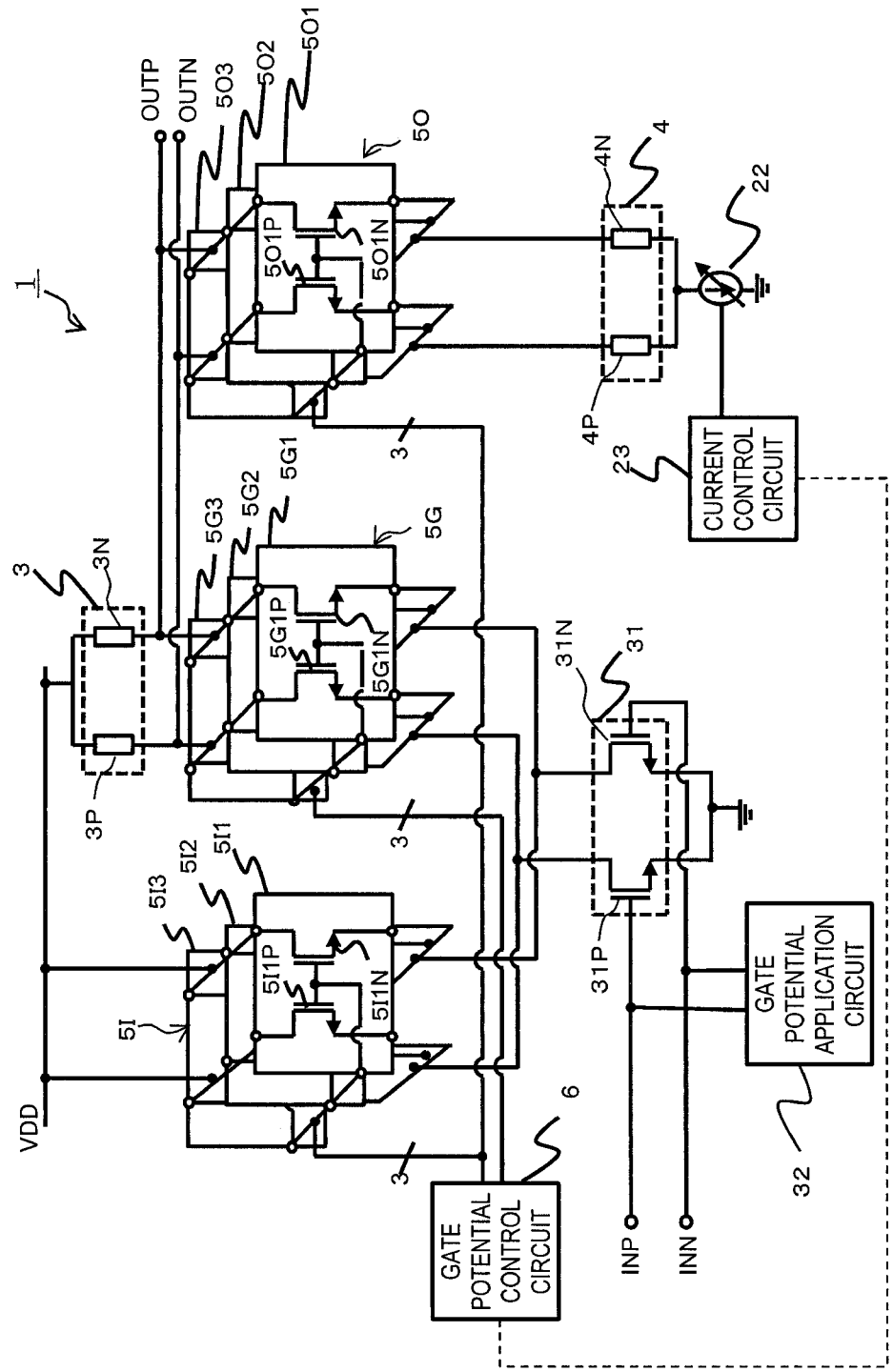
FIG. 3 is a configuration diagram for illustrating a variable gain amplifier according to a third embodiment of the present invention.

FIG. 3 is a configuration diagram for illustrating a variable gain amplifier according to a third embodiment of the present invention. Referring to FIG. 3, differences from the second embodiment described above will be described in detail.

In the third embodiment, as illustrated in FIG. 3, the first load element pair 2 is replaced by an amplifier circuit 31. The amplifier circuit 31 is a differential pair including two transistors 31P and 31N each having a source grounded. Each of the two transistors 31P and 31N are both N-channel MOSFETs. One of the two transistors forming the input dummy 5IN and one of the two transistors forming the amplifier circuit 5GN has the source connected to a drain of the transistor 31P. Each of the other of the two transistors forming the input dummy 5IN and the other of the two transistors forming the amplifier circuit 5GN has the source connected to a drain of the transistor 31N.

The input terminal INP is connected to a gate of the transistor 31P, and the input terminal INN is connected to a gate of the transistor 31N. Each of the transistors 31P and 31N has the gate further connected to a gate potential application circuit 32. The gate potential application circuit 32 is, for example, a circuit configured to generate a constant voltage.

In this way, also in the third embodiment in which the first load element pair 2 is replaced by the amplifier circuit 31, similar effects to those of the first embodiment described above are obtained.

Fourth Embodiment

Figure 4:
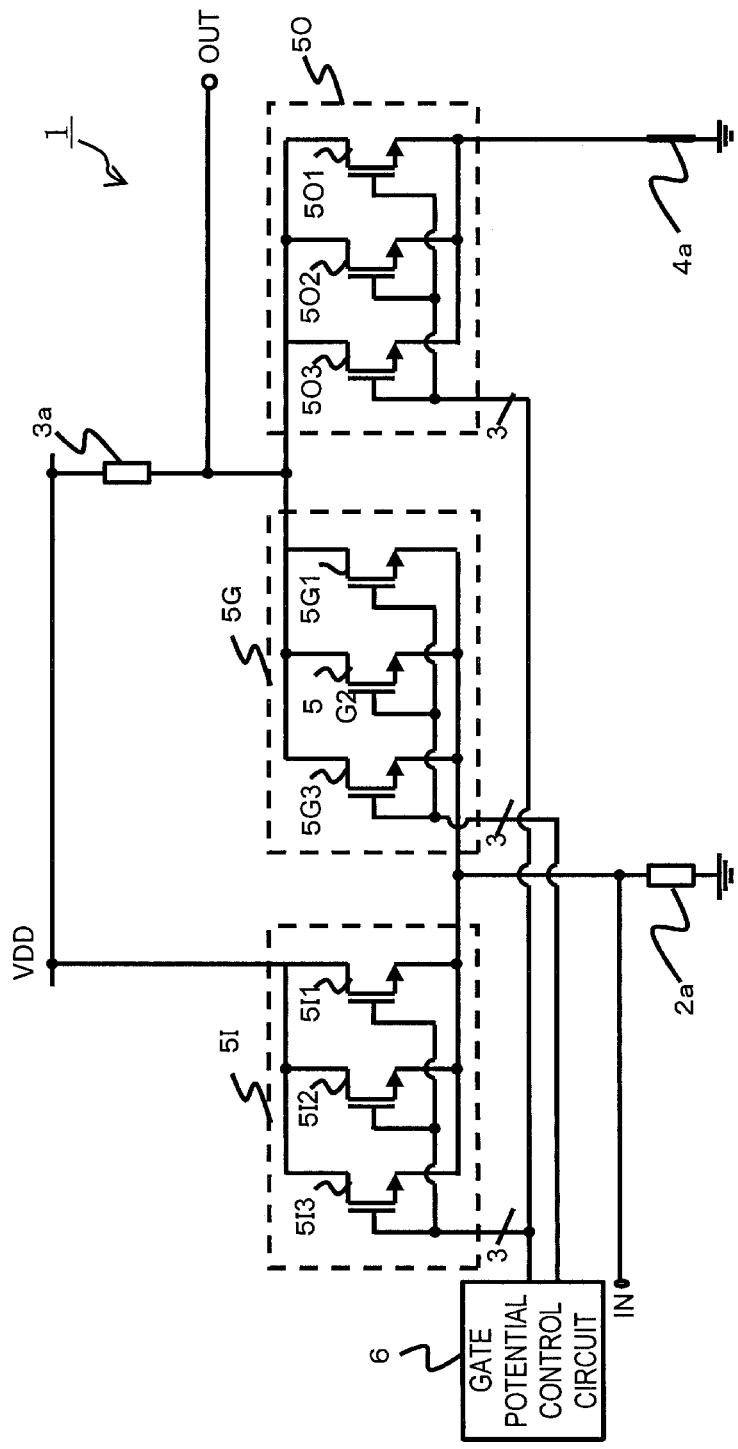
FIG. 4 is a configuration diagram for illustrating a variable gain amplifier according to a fourth embodiment of the present invention.

FIG. 4 is a configuration diagram for illustrating a variable gain amplifier circuit according to a fourth embodiment of the present invention. Referring to FIG. 4, differences from the first embodiment described above will be described in detail.

In the first embodiment described above, all the input dummies 5IN, the amplifier circuits 5GN, and the output dummies 5ON are differential pairs, respectively. In contrast, in the fourth embodiment, as illustrated in FIG. 4, all the input dummies 5IN, the amplifier circuits 5GN, and the output dummies 5ON are transistors, respectively. Thus, the first load element pair 2 is replaced by a first load element 2a. Similarly, the second load element pair 3 is replaced by a second load element 3a, and the third load element pair 4 is replaced by a third load element 4a. An input terminal IN is connected to the other terminal of the first load element 2a, that is, connected to the sources of the input dummies 5I1 to 5I3 and the sources of the amplifier circuits 5G1 to 5G3, respectively. An output terminal OUT is connected to the power supply line VDD via the second load element 3a. Even in this configuration, the same effects as those in the first embodiment described above are obtained. Specifically, the variation of the pass phase due to the change in gain can be avoided, or the variation can be suppressed within an extremely narrow range.

In the fourth embodiment, the input dummy group 5I, the amplifier circuit group 5G, and the output dummy group 5O are caused to operate in a unit of transistor, but this configuration is not always required. Specifically, for one of the input dummy group 5I, the amplifier circuit group 5G, and the output dummy group 5O, or for two thereof, a differential pair may be adopted, in the same manner as in the first to third embodiments described above.

Fifth Embodiment

Figure 5:
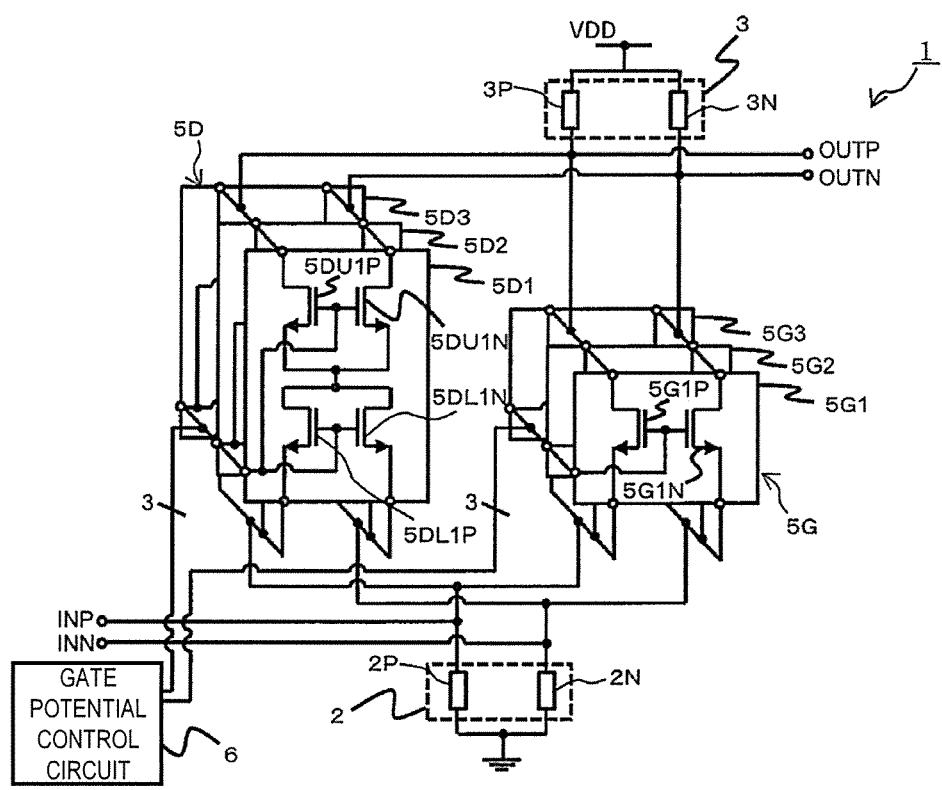
FIG. 5 is a configuration diagram for illustrating a variable gain amplifier according to a fifth embodiment of the present invention.

FIG. 5 is a configuration diagram for illustrating a variable gain amplifier according to a fifth embodiment of the present invention. Referring to FIG. 5, differences from the first embodiment described above will be described in detail.

In the first embodiment described above, by adding the output dummy group 5O, the variation of the output impedance due to the change in the gain is avoided, or the variation is suppressed. However, as a result of the addition of the output dummy group 5O, a power consumption amount increases. Thus, in the fifth embodiment, the power consumption amount is more suppressed as compared with the first embodiment described above.

In the fifth embodiment, as illustrated in FIG. 5, in order to suppress the power consumption amount, a configuration which does not include the output dummy group 5O is adopted. In the fifth embodiment, instead of arranging the output dummy group 5O, the input dummy group 5I is replaced by a dummy group 5D. The dummy group 5D corresponds to the second transistor group and the third transistor group in the fifth embodiment.

The dummy group 5D is a component having the functions of both the input dummy group 5I and the output dummy group 5O in the first embodiment described above. Thus, as illustrated in FIG. 5, the dummy group 5D is connected between the second load element pair 3 and the first load element pair 2. FIG. 5 illustrates three dummies 5D1 to 5D3 forming the dummy group 5D. Herein, when a specific dummy is not indicated, "5DN" is used as the reference symbol. The number of dummies 5DN forming the dummy group 5D is not limited to 3.

As illustrated in FIG. 5, each dummy 5DN is formed by connecting two stages of differential pairs in cascade to include four transistors in total. Specifically, in the dummy 5D1, an upper-stage differential pair that is a differential pair located on the second load element 3 side is formed by two transistors 5DU1P and 5DU1N which are N-channel MOSFETs. A lower-stage differential pair that is another differential pair is also formed by two transistors 5DL1P and 5DL1N which are N-channel MOSFETs.

The lower-stage differential pair corresponds to the differential pair forming the second transistor group in the fifth embodiment, and the upper-stage differential pair corresponds to the differential pair forming the third transistor group in the fifth embodiment. According to the above-described configuration, in the fifth embodiment, two drains of one differential pair forming the second transistor group and two sources of one differential pair forming the third transistor group are all connected so that the two differential pairs are connected in cascade, to form one dummy 5DN.

As illustrated in FIG. 5, the two transistors 5DU1P and 5DU1N forming the upper-stage differential pair have gates connected to each other and the sources connected to each other, and have drains connected to the load elements 3P and 3N, respectively. As illustrated in FIG. 5, the two transistors 5DL1P and 5DL1N forming the lower-stage differential pair have gates connected to each other and the drains connected to each other, and have sources connected to the load elements 2P and 2N, respectively. The sources of the two transistors 5DU1P and 5DU1N are connected to the drains of the two transistors 5DL1P and 5DL1N. In other words, respective input terminals of the two transistors 5DU1P and 5DU1N forming the upper-stage differential pair and respective output terminals of the two transistors 5DL1P and 5DL1N forming the lower-stage differential pair, which are four terminals in total, are all connected to one another.

The gates of the two transistors 5DU1P and 5DU1N are connected to the gates of the two transistors 5DL1P and 5DL1N, respectively, and signal lines for the connection are connected to the gate potential control circuit 6. According to the configuration, the same control signal is input to each of the gates of the four transistors forming the dummy 5DN, and the transistors are controlled in a unit of the dummy 5DN.

The gate potential control circuit 6 is configured to keep a total number of the number of dummies 5DN operating in the dummy group 5D and the number of amplifier circuits 5GN operating in the amplifier circuit group 5G at a constant value, and change a combination of those numbers depending on a gain to be set. According to the configuration, for example, when the total number is assumed to be three, under a state in which one dummy 5DN is caused to operate in the dummy group 5D, two amplifier circuits 5GN operate in the amplifier circuit group 5G. Under a state in which two dummies 5DN are caused to operate in the dummy group 5D, one amplifier circuit 5GN operates in the amplifier circuit group 5G.

As described above, each of the dummies 5DN forming the dummy group 5D is formed by connecting one differential pair forming the second transistor group and one differential pair forming the third transistor group in cascade. Thus, when the total number of the number of dummies 5DN operating in the dummy group 5D and the number of amplifier circuits 5GN operating in the amplifier circuit group 5G is kept at a constant value, the total number of transistors to be turned on in the second transistor group and the total number of transistors to be turned on in the third transistor group are the same. Further, the total number of transistors to be turned on in the first transistor group and the second transistor group is always kept at a constant value.

For example, when the dummy 5D1 is caused to operate, the gate potential control circuit 6 outputs a control signal for turning on the transistors 5DU1P, 5DU1N, 5DL1P, and 5DL1N. The two drains of the lower-stage differential pair are both connected to the upper-stage differential pair. With this control signal, when the dummy 5D1 is turned on, the two drains of the lower-stage differential pair are connected to each other, and signals having phases opposite to each other are consequently combined. As a result, a signal from the lower-stage differential pair is not actually input to the upper-stage differential pair, and then, even when the dummy 5D1 is turned on, the signal is also not output to the output terminals OUTP and OUTN from the upper-stage differential pair. However, the output impedance that is the impedance of the variable gain amplifier 1 viewed from the output terminals OUTP and OUTN reflects the impedance of the upper-stage differential pair. The same applies to the dummies 5DN other than the dummy 5D1.

In view of the above-described operations, also in the fifth embodiment, a total number of the number of dummies 5DN to be turned on and the number of amplifier circuits 5GN to be turned on is kept at a constant value, and a combination of those numbers is changed depending on a gain to be set. Thus, even when the gain is changed, the output impedance can be kept at a constant value, or the variation of the output impedance can be suppressed within an extremely narrow range. Accordingly, also in the fifth embodiment, the same effects as those in the first embodiment described above are obtained. Further, such a current path as the output dummy group 5O is not newly formed, and the power consumption amount can be more reduced as compared with the first embodiment described above.

Figure 6:
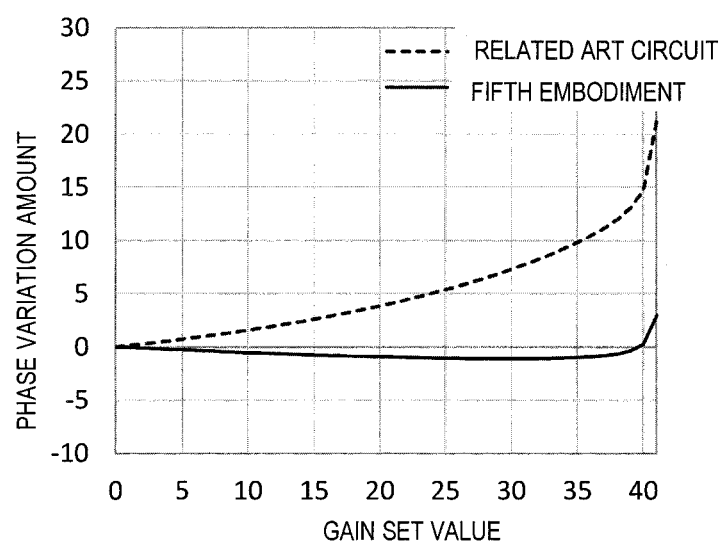
FIG. 6 is a graph for showing a variation amount of a pass phase in relation to a gain in the variable gain amplifier according to the fifth embodiment of the present invention.

FIG. 6 is a graph showing a variation amount of the pass phase in relation to the gain in the variable gain amplifier according to the fifth embodiment of the present invention. Variation amounts of the pass phase in relation to the gain were obtained by a simulation. In FIG. 6, the horizontal axis represents a gain set value, and the vertical axis represents a phase variation amount. A unit of the phase variation amount is degrees. The solid line indicates results of the fifth embodiment, and the broken line indicates results obtained with a related-art circuit, that is, results obtained with a related-art variable gain amplifier. The related-art circuit is obtained by removing the output dummy group 5O and the third load element pair 4 from the configuration of FIG. 1.

In the related-art circuit, the output impedance varies depending on the gain set value. Owing to the variation of the output impedance, as shown in FIG. 6, as the gain set value increases, an absolute value of the variation amount of the pass phase also increases. In contrast, in the fifth embodiment, even when the gain set value varies, the output impedance is constant, or is substantially constant. Thus, in the fifth embodiment, FIG. 6 exhibits characteristic in which the pass phase changes little even when the gain set value is changed. From the above-described results, it can be verified that suppression of a change in the output impedance due to the gain set value is effective in further enhancing the characteristic of the variable gain amplifier 1. Also in the first to fourth embodiments described above, the characteristic shown in FIG. 6 or characteristic close to the characteristic can be obtained.

Sixth Embodiment

Figure 7:
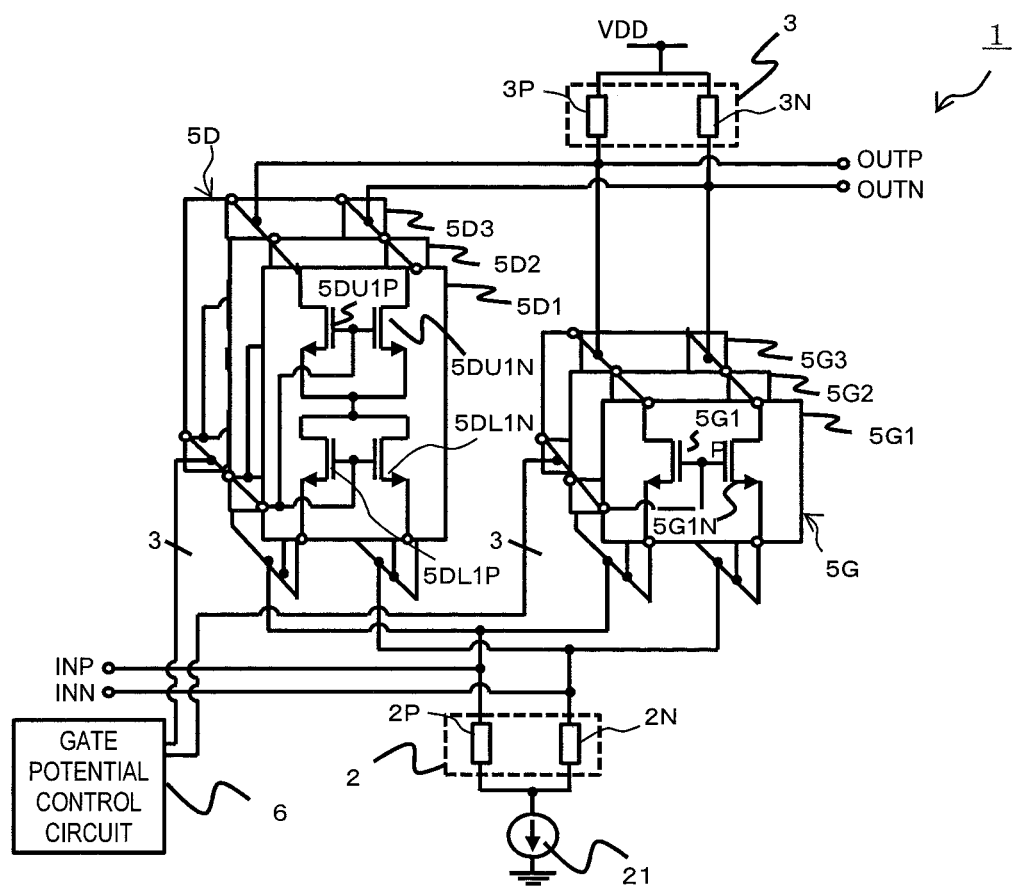
FIG. 7 is a configuration diagram for illustrating a variable gain amplifier according to a sixth embodiment of the present invention.

FIG. 7 is a configuration diagram for illustrating a variable gain amplifier according to a sixth embodiment of the present invention. Referring to FIG. 7, differences from the fifth embodiment described above will be described in detail.

In the sixth embodiment, as illustrated in FIG. 7, the constant current source 21 is arranged between the first load element pair 2 and the ground, and the dummy group 5D and the amplifier circuit group 5G are connected to the ground via the first load element pair 2 and the constant current source 21. Even when the constant current source 21 is added in this manner, the output impedance can be kept at a constant value, or the variation of the output impedance can be suppressed within an extremely narrow range. Accordingly, characteristic equivalent to that in the fifth embodiment described above can be achieved. The constant current source 21 is effective for increasing a precision of the gain.

Seventh Embodiment

Figure 8:
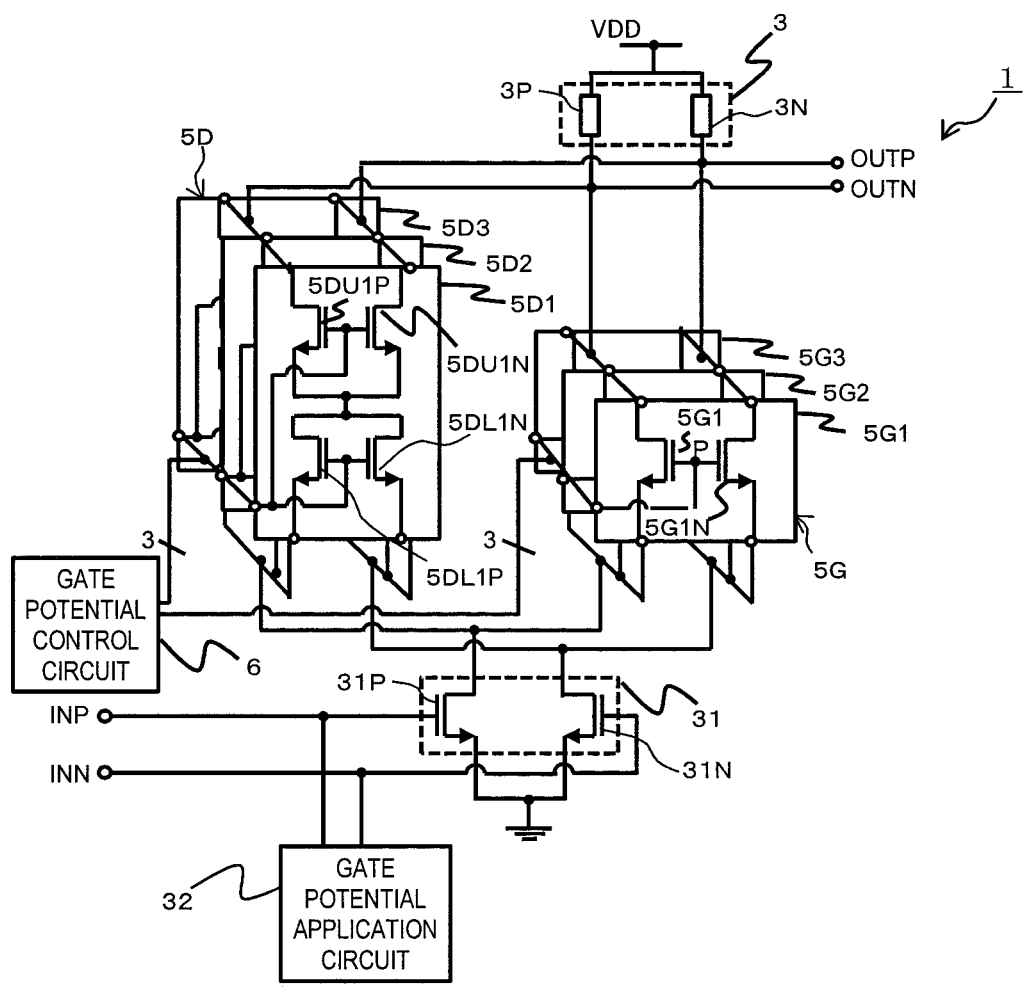
FIG. 8 is a configuration diagram for illustrating a variable gain amplifier according to a seventh embodiment of the present invention.

FIG. 8 is a configuration diagram for illustrating a variable gain amplifier according to a seventh embodiment of the present invention. Referring to FIG. 8, differences from the fifth embodiment described above will be described in detail.

In the seventh embodiment, as illustrated in FIG. 8, the first load element pair 2 in FIG. 5 described above is replaced by the amplifier circuit 31, and further, a gate potential application circuit 32 is added. The amplifier circuit 31 is, as in the third embodiment described above, the differential pair including the two transistors 31P and 31N each having the source grounded. Each of one of the two transistors forming the dummy 5DN and one of the two transistors forming the amplifier circuit 5GN has the source connected to the drain of the transistor 31P. Each of the other of the two transistors forming the dummy 5DN and the other of the two transistors forming the amplifier circuit 5GN has the source connected to the drain of the transistor 31N.

The input terminal INP is connected to the gate of the transistor 31P, and the input terminal INN is connected to the gate of the transistor 31N. The gate of each of the transistors 31P and 31N is further connected to the gate potential application circuit 32.

As described above, also in the seventh embodiment in which the first load element pair 2 is replaced by the amplifier circuit 31, the output impedance can be kept at a constant value, or the variation of the output impedance can be suppressed within an extremely narrow range. Accordingly, similar effects to those of the fifth embodiment described above are obtained.

REFERENCE SIGNS LIST 1 variable gain amplifier, 2 first load element pair, 2a first load element, 2P, 2N, 3P, 3N, 4P, 4N load element, 3a second load element, 4a third load element, 5D dummy group (second transistor group and third transistor group), 5D1 to 5D3 dummy, 5I input dummy group (second transistor group), 5I1 to 5I3 input dummy, 5DL1P, 5DL1N, 5DU1P, 5DU1N, 5I1P, 5I1N, 5G1P, 5G1N, 5O1P, 5O1N, 31P, 31N transistor, 5G amplifier circuit group (first transistor group), 5G1 to 5G3, 31 amplifier circuit, 5O output dummy group (third transistor group), 5O1 to 5O3 output dummy, 6 gate potential control circuit (controller), 21 constant current source, 22 variable current source, 23 current control circuit (current controller), 32 gate potential application circuit (voltage application unit)

What is claimed is:
1. A variable gain amplifier, comprising:
a first transistor group which is connected to an input terminal and an output terminal, and which forms a plurality of first differential pairs, the plurality of first differential pairs being connected in parallel and being configured to amplify a signal from the input terminal to output the amplified signal to the output terminal;

a second transistor group which forms a plurality of second differential pairs connected in parallel to the input terminal, source-side terminals of respective transistors forming each of the plurality of second differential pairs being connected to the input terminal, and drain-side terminals of the respective transistors being connected to each other;

a third transistor group which is connected in parallel to the output terminal, which forms a plurality of third differential pairs connected in cascade respectively to the plurality of second differential pairs formed by the second transistor group, a source-side terminal and a drain-side terminal of each transistor forming each third differential pair included in the plurality of third differential pairs being connected to the drain-side terminal of each transistor forming the second differential pair connected in cascade to the third differential pair and the output terminal, respectively;

a controller configured to turn on/off the transistors in a unit of each of the first differential pair of the first transistor group, the second differential pair of the second transistor group, and the third differential pair of the third transistor group, so as to keep a total number of the number of transistors to be turned on in the first transistor group and the number of transistors to be turned on in the second transistor group at a constant value, and keep a total number of the number of transistors to be turned on in the first transistor group and the number of transistors to be turned on in the third transistor group at a constant value, to thereby control the first transistor group, the second transistor group, and the third transistor group;

a first load element having one terminal connected to a ground and having another terminal connected to the input terminal; and a second load element having one terminal connected to a power supply line and having another terminal connected to the output terminal, wherein the plurality of first differential pairs formed by the first transistor group are connected in parallel between the other terminal of the first load element and the other terminal of the second load element, wherein the source-side terminal of each transistor of each of the plurality of second differential pairs formed by the second transistor group is connected to the other terminal of the first load element, and wherein the drain-side terminal of each transistor of each of the plurality of third differential pairs formed by the third transistor group is connected to the other terminal of the second load element.

2. The variable gain amplifier according to claim 1, further comprising a constant current source connected between the one terminal of the first load element and the ground.

3. The variable gain amplifier according to claim 1, wherein an amplifier circuit including a transistor having a gate connected to the input terminal is arranged in place of the first load element, and the variable gain amplifier further comprising a voltage application unit configured to apply a voltage to the gate of the amplifier circuit.

* * * * *